(12) United States Patent
Xia et al.

(10) Patent No.: US 11,725,282 B2
(45) Date of Patent: *Aug. 15, 2023

(54) SUPPRESSION OF PARASITIC DEPOSITION IN A SUBSTRATE PROCESSING SYSTEM BY SUPPRESSING PRECURSOR FLOW AND PLASMA OUTSIDE OF SUBSTRATE REGION

(71) Applicant: Novellus Systems, Inc., Fremont, CA (US)

(72) Inventors: Chunguang Xia, Tualatin, OR (US); Ramesh Chandrasekharan, Portland, OR (US); Douglas Keil, West Linn, OR (US); Edward J. Augustyniak, Tualatin, OR (US); Karl Frederick Leeser, West Linn, OR (US)

(73) Assignee: Novellus Systems, Inc., Fremont, CA (US)

( * ) Notice: Subject to any disclaimer, the term of this patent is extended or adjusted under 35 U.S.C. 154(b) by 158 days.

This patent is subject to a terminal disclaimer.

(21) Appl. No.: 17/445,562

(22) Filed: Aug. 20, 2021

(65) Prior Publication Data
US 2021/0381106 A1 Dec. 9, 2021

Related U.S. Application Data

(60) Division of application No. 16/410,057, filed on May 13, 2019, now Pat. No. 11,111,581, which is a
(Continued)

(51) Int. Cl.
*C23C 16/455* (2006.01)
*C23C 16/44* (2006.01)
(Continued)

(52) U.S. Cl.
CPC .... *C23C 16/45565* (2013.01); *C23C 16/4401* (2013.01); *C23C 16/4558* (2013.01);
(Continued)

(58) Field of Classification Search
CPC .......... C23C 16/45565; C23C 16/4401; C23C 16/45502; C23C 16/45508;
(Continued)

(56) References Cited

U.S. PATENT DOCUMENTS 2,124,940 A   7/1938   Zink
2,679,821 A   6/1954   Kuebler
(Continued)

FOREIGN PATENT DOCUMENTS

CN   1468441 A   1/2004
CN   1777696 A   5/2006
(Continued)

OTHER PUBLICATIONS

Machine translation of JP2010-059522 A (Year: 2010).*
(Continued)

*Primary Examiner* — Jeffrie R Lund
(74) *Attorney, Agent, or Firm* — Weaver Austin Villeneuve & Sampson LLP

(57) ABSTRACT

A method for operating a substrate processing system includes delivering precursor gas to a chamber using a showerhead that includes a head portion and a stem portion. The head portion includes an upper surface, a sidewall, a lower planar surface, and a cylindrical cavity and extends radially outwardly from one end of the stem portion towards sidewalls of the chamber. The showerhead is connected, using a collar, to an upper surface of the chamber. The collar is arranged around the stem portion. Process gas is flowed into the cylindrical cavity via the stem portion and through a plurality of holes in the lower planar surface to distribute the process gas into the chamber. A purge gas is supplied through slots of the collar into a cavity defined between the head portion and an upper surface of the chamber.

12 Claims, 8 Drawing Sheets

Related U.S. Application Data continuation of application No. 15/177,548, filed on Jun. 9, 2016, now Pat. No. 10,287,683, which is a division of application No. 13/659,231, filed on Oct. 24, 2012, now Pat. No. 9,388,494.

(60) Provisional application No. 61/663,802, filed on Jun. 25, 2012.

(51) Int. Cl.
*C23C 16/509* (2006.01)
*H01J 37/32* (2006.01)

(52) U.S. Cl.
CPC .. *C23C 16/45502* (2013.01); *C23C 16/45508* (2013.01); *C23C 16/45519* (2013.01); *C23C 16/45525* (2013.01); *C23C 16/45591* (2013.01); *C23C 16/5096* (2013.01); *H01J 37/3244* (2013.01)

(58) Field of Classification Search
CPC ........ C23C 16/45519; C23C 16/45525; C23C 16/4558; C23C 16/45591; C23C 16/5096; C23C 16/513; C23C 16/4408; C23C 16/45536; C23C 16/45544; H01J 37/3244
See application file for complete search history.

(56) References Cited

U.S. PATENT DOCUMENTS

| | | | |
|---|---|---|---|
| 3,621,812 A | 11/1971 | Hissong, Jr. et al. |
| 4,673,447 A | 6/1987 | Sakai et al. |
| 4,961,399 A | 10/1990 | Frijlink |
| 4,989,541 A | 2/1991 | Mikoshiba et al. |
| 5,399,254 A | 3/1995 | Geisler et al. |
| 5,453,124 A | 9/1995 | Moslehi et al. |
| 5,532,190 A | 7/1996 | Goodyear et al. |
| 5,580,387 A | 12/1996 | Chen |
| 5,614,026 A | 3/1997 | Williams |
| 5,747,362 A | 5/1998 | Visser |
| 5,871,811 A | 2/1999 | Wang et al. |
| 5,892,235 A | 4/1999 | Yamazaki et al. |
| 5,954,881 A | 9/1999 | Burk, Jr. et al. |
| 6,002,109 A | 12/1999 | Johnsgard et al. |
| 6,059,885 A | 5/2000 | Ohashi et al. |
| 6,132,512 A | 10/2000 | Horie et al. |
| 6,143,081 A | 11/2000 | Shinriki et al. |
| 6,149,727 A | 11/2000 | Yoshioka et al. |
| 6,183,563 B1 | 2/2001 | Choi et al. |
| 6,192,858 B1 | 2/2001 | Nieberding |
| 6,217,715 B1 | 4/2001 | Sun et al. |
| 6,285,010 B1 | 9/2001 | Fujikawa et al. |
| 6,289,842 B1 | 9/2001 | Tompa |
| 6,302,965 B1 | 10/2001 | Umotoy et al. |
| 6,333,272 B1 | 12/2001 | McMillin et al. |
| 6,387,182 B1 | 5/2002 | Horie et al. |
| 6,403,925 B1 | 6/2002 | Johnsgard et al. |
| 6,444,039 B1 | 9/2002 | Nguyen |
| 6,478,872 B1 | 11/2002 | Chae et al. |
| 6,495,233 B1 | 12/2002 | Shmurun et al. |
| 6,499,425 B1 | 12/2002 | Sandhu et al. |
| 6,830,624 B2 | 12/2004 | Janakiraman et al. |
| 6,849,241 B2 | 2/2005 | Dauelsberg et al. |
| 6,899,764 B2 | 5/2005 | Frijlink |
| 6,998,014 B2 | 2/2006 | Chen et al. |
| 7,017,514 B1 | 3/2006 | Shepherd, Jr. et al. |
| 7,572,337 B2 | 8/2009 | Rocha-Alvarez et al. |
| 7,622,005 B2 | 11/2009 | Balasubramanian et al. |
| 7,758,698 B2 | 7/2010 | Bang et al. |
| 8,092,598 B2 | 1/2012 | Baek et al. |
| 8,100,081 B1 | 1/2012 | Henri et al. |
| 8,137,467 B2 | 3/2012 | Meinhold et al. |
| 8,152,924 B2 | 4/2012 | Dauelsberg et al. |
| 8,197,636 B2 | 6/2012 | Shah et al. |
| 8,409,351 B2 | 4/2013 | Robbins et al. |
| 8,637,411 B2 | 1/2014 | Swaminathan et al. |
| 8,715,455 B2 | 5/2014 | Breka |
| 8,728,956 B2 | 5/2014 | LaVoie et al. |
| 8,871,654 B2 | 10/2014 | Kato et al. |
| 8,882,913 B2 | 11/2014 | Byun et al. |
| 8,956,983 B2 | 2/2015 | Swaminathan et al. |
| 8,968,512 B2 | 3/2015 | Nishimoto |
| 8,999,859 B2 | 4/2015 | Swaminathan et al. |
| 9,388,494 B2 | 7/2016 | Xia et al. |
| 9,399,228 B2 | 7/2016 | Breiling et al. |
| 9,449,795 B2 * | 9/2016 | Sabri ................ H01J 37/3244 |
| 9,508,547 B1 | 11/2016 | Pasquale et al. |
| 9,617,638 B2 | 4/2017 | LaVoie et al. |
| 9,677,176 B2 | 6/2017 | Chandrasekharan et al. |
| 9,738,977 B1 | 8/2017 | Karim et al. |
| 9,793,096 B2 * | 10/2017 | Kang ................ H01J 37/3244 |
| 10,202,691 B2 | 2/2019 | Karim et al. |
| 10,287,683 B2 | 5/2019 | Xia et al. |
| 10,316,409 B2 | 6/2019 | Van Schravendijk |
| 10,407,773 B2 | 9/2019 | LaVoie et al. |
| 10,665,429 B2 * | 5/2020 | Kang ................ C23C 16/509 |
| 11,111,581 B2 * | 9/2021 | Xia ................ C23C 16/45519 |
| 2001/0008205 A1 | 7/2001 | Wilke et al. |
| 2002/0039625 A1 | 4/2002 | Powell et al. |
| 2002/0104556 A1 | 8/2002 | Puri et al. |
| 2003/0019580 A1 | 1/2003 | Strang |
| 2003/0054099 A1 | 3/2003 | Jurgensen et al. |
| 2003/0070620 A1 | 4/2003 | Cooperberg et al. |
| 2003/0075273 A1 | 4/2003 | Kilpela et al. |
| 2003/0077388 A1 | 4/2003 | Byun |
| 2003/0153177 A1 | 8/2003 | Tepman et al. |
| 2003/0192476 A1 | 10/2003 | Fork et al. |
| 2004/0011286 A1 | 1/2004 | Kwon |
| 2004/0168769 A1 | 9/2004 | Matsuoka et al. |
| 2004/0216844 A1 | 11/2004 | Janakirarnan et al. |
| 2005/0263072 A1 | 12/2005 | Balasubramanian et al. |
| 2005/0263248 A1 | 12/2005 | Rocha-Alvarez et al. |
| 2005/0263484 A1 | 12/2005 | Park et al. |
| 2005/0268856 A1 | 12/2005 | Miller et al. |
| 2006/0090705 A1 | 5/2006 | Kim |
| 2006/0130756 A1 | 6/2006 | Liang et al. |
| 2006/0196420 A1 | 9/2006 | Ushakov et al. |
| 2006/0196603 A1 | 9/2006 | Lei et al. |
| 2006/0213439 A1 | 9/2006 | Ishizaka |
| 2006/0263522 A1 | 11/2006 | Byun |
| 2007/0293043 A1 | 12/2007 | Singh et al. |
| 2008/0121177 A1 | 5/2008 | Bang et al. |
| 2008/0121179 A1 | 5/2008 | Park et al. |
| 2008/0124944 A1 | 5/2008 | Park et al. |
| 2008/0173401 A1 | 7/2008 | Jeon |
| 2008/0185104 A1 | 8/2008 | Brcka |
| 2008/0185284 A1 | 8/2008 | Chen et al. |
| 2008/0188087 A1 | 8/2008 | Chen et al. |
| 2008/0241384 A1 | 10/2008 | Jeong et al. |
| 2008/0280068 A1 | 11/2008 | Ahn |
| 2008/0308040 A1 | 12/2008 | Dauelsberg et al. |
| 2009/0038541 A1 | 2/2009 | Robbins et al. |
| 2009/0056629 A1 | 3/2009 | Katz et al. |
| 2009/0095219 A1 | 4/2009 | Meinhold et al. |
| 2009/0095220 A1 | 4/2009 | Meinhold et al. |
| 2009/0109595 A1 | 4/2009 | Herchen et al. |
| 2009/0138541 A1 | 5/2009 | Wing et al. |
| 2009/0159424 A1 | 6/2009 | Liu et al. |
| 2009/0233434 A1 | 9/2009 | Kim et al. |
| 2009/0270849 A1 | 10/2009 | Truckai et al. |
| 2010/0003406 A1 | 1/2010 | Lam et al. |
| 2010/0048028 A1 | 2/2010 | Rasheed et al. |
| 2010/0055342 A1 | 3/2010 | Chiang et al. |
| 2010/0078578 A1 | 4/2010 | Schuermann et al. |
| 2010/0273291 A1 | 10/2010 | Kryliouk et al. |
| 2010/0288728 A1 | 11/2010 | Han et al. |
| 2011/0195202 A1 | 8/2011 | Dahm |
| 2011/0198417 A1 | 8/2011 | Detmar et al. |
| 2011/0253044 A1 | 10/2011 | Tam et al. |
| 2011/0300695 A1 | 12/2011 | Horii et al. |
| 2012/0009802 A1 | 1/2012 | LaVoie et al. |
| 2012/0043198 A1 | 2/2012 | Yamazaki |
| 2012/0161405 A1 | 6/2012 | Mohn et al. |
| 2012/0269968 A1 | 10/2012 | Rayner, Jr. |

(56) References Cited

U.S. PATENT DOCUMENTS

| | | | |
|---|---|---|---|
| 2012/0318025 | A1 | 12/2012 | Milicevic et al. |
| 2013/0092086 | A1 | 4/2013 | Keil et al. |
| 2013/0171834 | A1 | 7/2013 | Haverkamp et al. |
| 2013/0341433 | A1 | 12/2013 | Roy et al. |
| 2013/0344245 | A1 | 12/2013 | Xia et al. |
| 2014/0011369 | A1 | 1/2014 | Kato et al. |
| 2014/0044889 | A1 | 2/2014 | Qi et al. |
| 2014/0072726 | A1 | 3/2014 | Kim |
| 2014/0123900 | A1 | 5/2014 | Wang et al. |
| 2014/0179114 | A1 | 6/2014 | van Schravendijk |
| 2014/0209562 | A1 | 7/2014 | LaVoie et al. |
| 2014/0217193 | A1 | 8/2014 | Breiling et al. |
| 2014/0235069 | A1 | 8/2014 | Breiling et al. |
| 2014/0238608 | A1* | 8/2014 | Sabri ............... C23C 16/505 239/548 |
| 2015/0007770 | A1 | 1/2015 | Chandrasekharan et al. |
| 2015/0017812 | A1 | 1/2015 | Chandrasekharan et al. |
| 2015/0030766 | A1 | 1/2015 | Lind et al. |
| 2015/0048739 | A1 | 2/2015 | Forster et al. |
| 2015/0136028 | A1 | 5/2015 | Park et al. |
| 2015/0147889 | A1 | 5/2015 | Yudovsky et al. |
| 2015/0155157 | A1 | 6/2015 | Song et al. |
| 2015/0167168 | A1 | 6/2015 | Keshavamurthy et al. |
| 2015/0194298 | A1 | 7/2015 | Lei et al. |
| 2015/0200110 | A1 | 7/2015 | Li et al. |
| 2015/0243490 | A1 | 8/2015 | Ryu et al. |
| 2015/0262792 | A1 | 9/2015 | Bera |
| 2015/0275364 | A1 | 10/2015 | Thompson et al. |
| 2015/0299855 | A1 | 10/2015 | Yudovsky et al. |
| 2015/0299909 | A1 | 10/2015 | Mizuno et al. |
| 2015/0368798 | A1 | 12/2015 | Kwong |
| 2015/0380221 | A1 | 12/2015 | Liu et al. |
| 2016/0035566 | A1 | 2/2016 | LaVoie et al. |
| 2016/0068953 | A1 | 3/2016 | Li et al. |
| 2016/0079036 | A1 | 3/2016 | Kang et al. |
| 2016/0097122 | A1 | 4/2016 | Yudovsky et al. |
| 2016/0138160 | A1 | 5/2016 | Lambert et al. |
| 2016/0289832 | A1 | 10/2016 | Xia et al. |
| 2017/0167017 | A1 | 6/2017 | LaVoie et al. |
| 2017/0362713 | A1 | 12/2017 | Karim et al. |
| 2018/0012733 | A1 | 1/2018 | Phillips et al. |
| 2018/0068833 | A1* | 3/2018 | Kang ............... C23C 16/405 |
| 2019/0271081 | A1 | 9/2019 | Xia et al. |
| 2021/0381106 | A1* | 12/2021 | Xia ............... C23C 16/4401 |
| 2023/0005740 | A1* | 1/2023 | Brady ............... C23C 16/4404 |

FOREIGN PATENT DOCUMENTS

| | | |
|---|---|---|
| CN | 201343570 Y | 11/2009 |
| CN | 101657565 A | 2/2010 |
| CN | 102087955 A | 6/2011 |
| CN | 102136410 A | 7/2011 |
| CN | 102246274 A | 11/2011 |
| CN | 103003924 A | 3/2013 |
| CN | 103510072 A | 1/2014 |
| CN | 103526183 A | 1/2014 |
| CN | 105316651 A | 2/2016 |
| JP | H1-309973 A | 12/1989 |
| JP | H05218002 A | 8/1993 |
| JP | H7-312348 A | 11/1995 |
| JP | 8-115879 A | 5/1996 |
| JP | H 08-148439 A | 6/1996 |
| JP | 2000-297368 A | 10/2000 |
| JP | 2003-536272 A | 12/2003 |
| JP | 2005142355 A | 6/2005 |
| JP | 2005-303292 A | 10/2005 |
| JP | 2009-71017 A | 4/2009 |
| JP | 2009135201 A | 6/2009 |
| JP | 2009149951 A | 7/2009 |
| JP | 2010-059522 A | 3/2010 |
| JP | 2010206026 A | 9/2010 |
| JP | 4880175 B2 | 2/2012 |
| JP | 2014-012891 A | 1/2014 |
| JP | 2016021564 A | 2/2016 |
| JP | 2016036020 A | 3/2016 |
| KR | 100453298 B1 | 10/2004 |
| KR | 10-0616486 B | 8/2006 |
| KR | 100634326 B1 | 10/2006 |
| KR | 20070098104 A | 10/2007 |
| KR | 10-2007-0112354 A | 11/2007 |
| KR | 10-0891035 B1 | 3/2009 |
| KR | 20090097735 A | 9/2009 |
| KR | 2010-0029041 A | 3/2010 |
| KR | 20130133488 A | 12/2013 |
| KR | 20140000447 A | 1/2014 |
| KR | 20140071402 A | 6/2014 |
| KR | 20160017610 A | 2/2016 |
| KR | 20160022256 A | 2/2016 |
| TW | 495801 B | 7/2002 |
| TW | 2009/32945 A | 8/2009 |
| TW | I423383 B | 1/2014 |
| TW | 2014/16488 A | 5/2014 |
| TW | 2015/16174 A | 5/2015 |
| WO | WO-2009029902 A1 * | 3/2009 ........... B23K 26/364 |
| WO | WO 2014/092085 A1 | 6/2014 |
| WO | WO-2015161225 A1 | 10/2015 |
| WO | WO-2016040448 A1 | 3/2016 |

OTHER PUBLICATIONS

Armaou, Antonios, et al., "Plasma enhanced chemical vapor deposition: Modeling and control". Chemical Engineering Science 54 (1999) 3305-3314.
Chinese Notice of Reexamination dated Jul. 29, 2021 issued in CN 201710462095.2.
CN Office Action dated Dec. 9, 2021, in Application No. CN201710462095.2 with English translation.
CN Office Action dated Jul. 19, 2022, in application No. 201710462095.2 with English translation.
Howling, A.A., et al., "Plasma deposition in an ideal showerhead reactor: a two-dimensional analytical solution". Plasma Sources, Sci. Technol. 21 (2012) 015005 pp. 1-15.
International Preliminary Report on Patentability dated Jan. 27, 2022, for Application No. PCT/US2020/070250.
International Search Report and Written Opinion dated Nov. 2, 2020 issued in Application No. PCT/US2020/070250.
Japanese First Office Action dated Jun. 30, 2021 issued in JP 2017-113915.
Japanese Office Action dated Feb. 22, 2022 issued in JP 2019-110244.
Japanese Second Office Action dated Feb. 28, 2022 issued in JP 2017-113915.
JP Office Action dated Jun. 14, 2022 in Application No. JP20200138491.
JP Office Action dated Mar. 1, 2022, in Application No. JP2017-113915 with English translation.
JP Office Action dated Mar. 1, 2022, in Application No. JP2019-110244 with English translation.
JP Office Action dated Oct. 12, 2021, in application No. JP2019110244.
JP Office Action dated Oct. 19, 2021, in application No. JP2020138491 with English translation.
KR Office Action dated Apr. 21, 2022, in application No. KR1020210112067 with English translation.
KR Office Action dated Aug. 8, 2022, in Application No. KR10-2022-0089613 with English translation.
KR Office Action dated Dec. 9, 2022, in Application No. KR10-2022-0128950 With English Translation.
KR Office Action dated Feb. 7, 2023 in Application No. KR10-2022-0055269 with English translation.
KR Office Action dated Feb. 8, 2022, in Application No. KR1020210166181 with English translation.
KR Office Action dated Jul. 13, 2022 in Application No. KR10-2015-0103671 With English Translation.
KR Office Action dated Nov. 22, 2021, in Application No. KR1020150103671 with English translation.
KR Office Action dated Oct. 22, 2021, in application No. KR10-2021-0112067 with English Translation.
SG Office Action dated May 18, 2022, in Application No. SG10202012689Y.

(56) References Cited

OTHER PUBLICATIONS

U.S. Notice of Allowance dated May 26, 2021 issued in U.S. Appl. No. 16/410,057.
U.S. Office Action dated Dec. 15, 2015 issued in U.S. Appl. No. 14/447,203.
U.S. Notice of Allowance dated Jul. 29, 2016 issued in U.S. Appl. No. 14/447,203.
U.S. Notice of Allowance dated Nov. 8, 2016 issued in U.S. Appl. No. 14/447,203.
U.S. Notice of Allowance dated Feb. 24, 2017 issued in U.S. Appl. No. 14/447,203.
U.S. Office Action dated Nov. 2, 2018 issued in U.S. Appl. No. 15/445,632.
U.S. Notice of Allowance dated May 1, 2019 issued in U.S. Appl. No. 15/445,632.
U.S. Office Action dated Nov. 22, 2016 issued in U.S. Appl. No. 15/186,275.
U.S. Notice of Allowance dated Apr. 14, 2017 issued in U.S. Appl. No. 15/186,275.
U.S. Notice of Allowance dated Jul. 20, 2016 issued in U.S. Appl. No. 14/828,291.
U.S. Office Action dated Jan. 18, 2018 issued in U.S. Appl. No. 15/636,128.
U.S. Final Office Action dated Jul. 6, 2018 issued in U.S. Appl. No. 15/636,128.
U.S. Notice of Allowance dated Sep. 21, 2018 issued in U.S. Appl. No. 15/636,128.
U.S. Office Action dated Jul. 17, 2014 issued in U.S. Appl. No. 13/659,231.
U.S. Final Office Aciton dated Dec. 18, 2014 issued in U.S. Appl. No. 13/659,231.
U.S. Notice of Allowance dated Mar. 17, 2016 issued in U.S. Appl. No. 13/659,231.
U.S. Office Action dated Sep. 7, 2018 issued in U.S. Appl. No. 15/177,548.
U.S. Notice of Allowance dated Dec. 19, 2018 issued in U.S. Appl. No. 15/177,548.
U.S. Office Action dated Nov. 13, 2020 issued in U.S. Appl. No. 16/410,057.
Chinese First Office Action dated Jul. 3, 2017 issued in CN 201510459965.1.
Chinese First Office Action dated Aug. 31, 2020 issued in CN 201811330813.1.
Japanese First Office Action dated Jun. 4, 2019 issued in JP 2015-144504.
Japanese Second Office Action dated Feb. 4, 2020 issued in JP 2015-144504.
Taiwanese Notice of Allowance and Search Report dated Jul. 25, 2019 issued in TW 108108815.
Taiwanese First Office Action dated Apr. 30, 2020 issued in TW 105126033.
Chinese First Office Action dated Mar. 1, 2019 issued in CN 201710462095.2.
Chinese Rejection Decision dated Aug. 1, 2019 issued in CN 201710462095.2.
Chinese First Office Action dated Oct. 31, 2016 issued in CN 201310256636.8.
Chinese First Office Action dated Jan. 2, 2019 issued in CN 201710251738.9.
Japanese Office Action dated May 29, 2017 issued in JP 2013-131699.
Japanese Decision to Grant dated May 14, 2019 issued in JP 2017224196.
Japanese Notice of Reasons for Refusal dated Jun. 19, 2020 issued in JP 2019-110244.
Korean Office Action dated Mar. 25, 2020 issued in KR 10-2013-0072651.
Korean Notice of Allowance dated Aug. 6, 2020 issued in KR 10-2013-0072651.
Korean First Office Action dated Nov. 23, 2020 issued in KR 10-2020-0146249.
Translation of the Notification of Examination Opinion dated Sep. 25, 2017, corresponding to Taiwanese Patent Application No. 105137740.
Search Report and Written Opinion corresponding to Singapore Application No. 2013 04839-2 dated Nov. 4, 2014.
Japanese Notice of Reasons for Refusal dated Jul. 17, 2018, issued in Application No. JP 2017-224196.
Japanese Second Office Action dated Feb. 24, 2021, issued in Application No. JP 2019-110244.
Taiwanese First Office Action dated Dec. 14, 2020, issued in Application No. TW 106119409.
Choo, J.O., et al., "Development of a spatially controllable chemical vapor deposition reactor with combinatorial processing capabilities". Review of Scientific Instruments 76, 062217 (2005), pp. 1-10.
Terry Day, "The Coanda Effect and Lift. Copyright 2008." pp. 1-27. <URL:https://basedados.aeroubi.pt/pluginfile.php/1169/mod_resource/content/0/THE_COANDA_EFFECT_AND_LIFT.pdf>.

\* cited by examiner

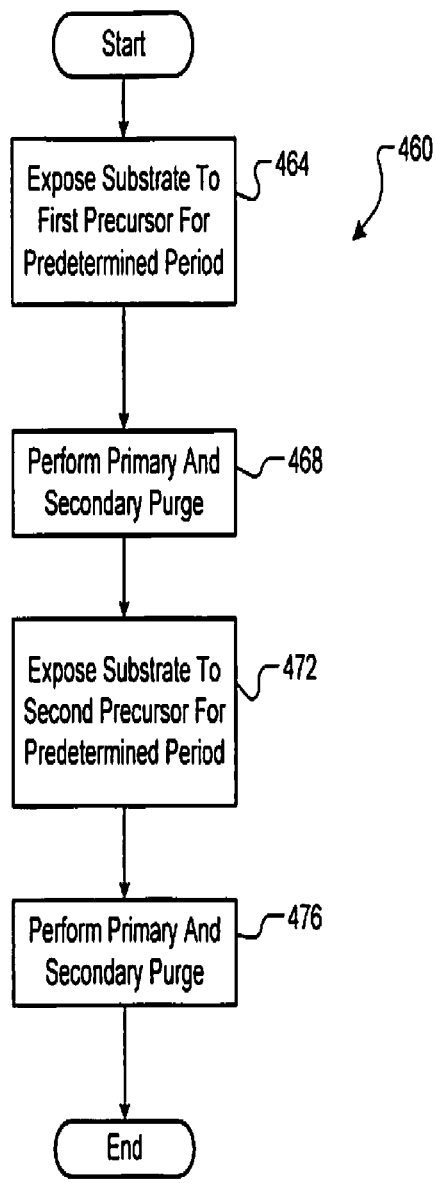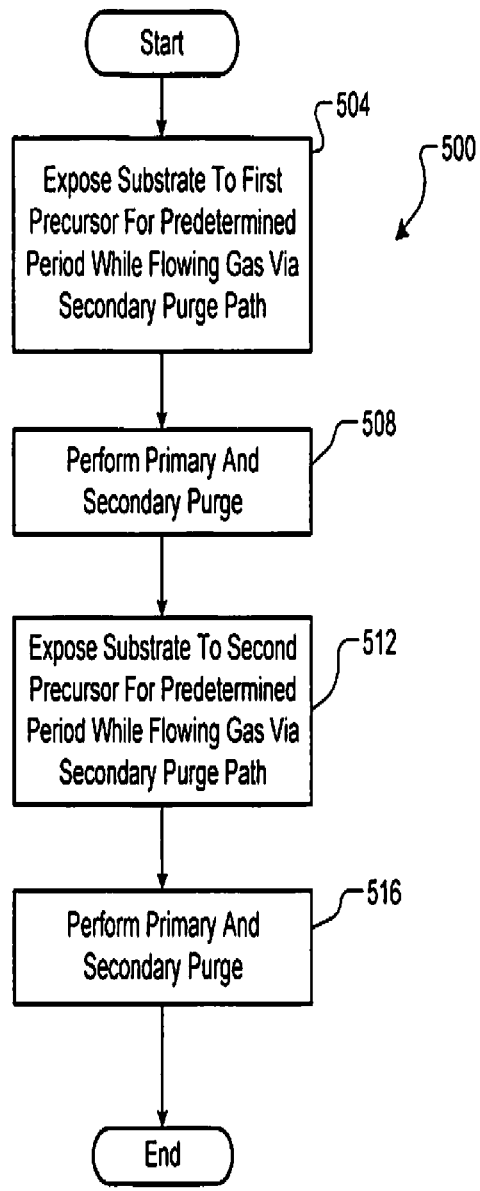
FIG. 10
FIG. 11

SUPPRESSION OF PARASITIC DEPOSITION IN A SUBSTRATE PROCESSING SYSTEM BY SUPPRESSING PRECURSOR FLOW AND PLASMA OUTSIDE OF SUBSTRATE REGION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

The present disclosure relates to substrate processing systems, and more specifically to suppression of parasitic deposition in a substrate processing system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems such as plasma-enhanced atomic layer deposition (PEALD) and plasma-enhanced chemical vapor deposition (PECVD) may be used to deposit and etch films on substrates such as semiconductor wafers. Some PEALD and PECVD systems include chandelier-type showerheads that supply precursor to a processing chamber.

The showerheads typically include a stem portion that extends into the processing chamber and a head portion connected to the stem portion. A cavity is formed behind the head portion between the head portion and an upper surface of the processing chamber. In other words, the showerhead creates dead volume in the cavity.

For continuum processes like PECVD, the cavity is not functionally a problem. However, for transient processes such as conformal film deposition (CFD) or ALD, the cavity stores chemistry that is emptied or exchanged in subsequent steps. Storage of the chemistry across the successive steps may result in time-varying contamination of the ambient. Reducing the cavity tends to bring the showerhead (which is usually powered with RF) closer to a top surface of the chamber (which is usually at ground). This can increase RF coupling to the chamber top surface. In some cases, the increased RF coupling can adversely impact the ability to strike plasma. Also the presence of stagnant chemistry in the cavity area can lead to deposition of films that eventually cause defects.

SUMMARY

A substrate processing system includes a showerhead that comprises a base portion and a stem portion and that delivers precursor gas to a chamber. A collar connects the showerhead to an upper surface of the chamber. The collar includes a plurality of slots, is arranged around the stem portion of the showerhead, and directs purge gas through the plurality of slots into a region between the base portion of the showerhead and the upper surface of the chamber.

In other features, the collar includes a base portion and a stem portion. The stem portion of the collar defines an inner cavity that receives the stem portion of the showerhead. A plate includes an opening that receives the stem portion of the showerhead. The plate is arranged between a lower edge of the stem portion of the collar and the base portion of the showerhead. The collar directs the purge gas between the plate and the stem portion of the showerhead and between the plate and the base portion of the showerhead.

In other features, one surface of the plate includes a plurality of first projections to provide uniform spacing between the plate and the base portion of the showerhead. The opening includes a plurality of second projections to provide uniform spacing between the plate and the stem portion of the showerhead.

In other features, the collar includes first passages arranged in the base portion of the collar. The collar includes second passages defined between a surface of the inner cavity of the stem portion of the collar and the stem portion of the showerhead. The purge gas flows through the first passages to the second passages and from the second passages through the slots.

In other features, the stem portion of the collar has a circular cross section. First passages are arranged in the base portion of the collar. Second passages are arranged in the stem portion of the collar. The purge gas flows through the first passages to the second passages and from the second passages through the slots.

In other features, N dielectric plates are arranged around the stem portion of the showerhead between the base portion of the showerhead and the upper surface of the chamber. The collar directs the purge gas at least one of above and below the N dielectric plates and between the N dielectric plates, where N is an integer greater than zero.

In other features, the cavity defines a plurality of first surfaces that are arranged in a spaced apart relationship around a first circumference and a plurality of arcuate surfaces that are arranged between the plurality of first surfaces. The plurality of arcuate surfaces curve radially outwardly relative to the plurality of first surfaces.

A method for operating a substrate processing system includes delivering precursor gas to a chamber using a showerhead, wherein the showerhead includes a base portion and a stem portion; connecting the showerhead to an upper surface of the chamber using a collar, wherein the collar is arranged around the stem portion of the showerhead; and supplying purge gas through slots of the collar into a region between the base portion of the showerhead and the upper surface of the chamber.

In other features, the collar includes a base portion and a stem portion. The stem portion of the collar defines an inner cavity that receives the stem portion of the showerhead. The method includes positioning a plate, including an opening that receives the stem portion of the showerhead, between a lower edge of the stem portion of the collar and the base portion of the showerhead.

In other features, the method includes directing the purge gas between the plate and the stem portion of the showerhead and between the plate and the base portion of the showerhead. The method includes spacing the plate relative to the base portion and the stem portion of the showerhead using a plurality of projections. The method includes providing first passages in the base portion of the collar and second passages between an inner surface of the cavity of the stem portion of the collar and the stem portion of the showerhead. The method includes flowing the purge gas through the first passages to the second passages and from the second passages through the slots.

In other features, the stem portion of the collar has a circular cross section. The method includes providing first passages in the base portion of the collar and second passages in the stem portion of the collar; and flowing the purge gas through the first passages to the second passages and from the second passages through the slots.

In other features, the method includes arranging N dielectric plates around the stem portion of the showerhead between the base portion of the showerhead and the surface of the chamber and directing the purge gas using the collar at least one of above and below the N dielectric plates and between the N dielectric plates, where N is an integer greater than zero. The substrate processing chamber performs atomic layer deposition.

A method includes arranging a substrate in a chamber of a substrate processing system below a showerhead that is attached to an upper surface of the substrate processing system using a collar; exposing the substrate to a first precursor for a first predetermined period; flowing purge gas through a primary purge path and a secondary purge path after the first predetermined period. The primary purge path flows the purge gas through the showerhead. The secondary purge path flows the purge gas through slots of the collar and between a base portion of the showerhead and the upper surface. The secondary purge path removes the first precursor. The method includes exposing the substrate to a second precursor for a second predetermined period.

In other features, the method includes flowing the purge gas through the primary purge path and the secondary purge path after the second predetermined period. The secondary purge path removes the second precursor between the base portion of the showerhead and the upper surface of the chamber. The method includes flowing the purge gas through the secondary purge path during the first predetermined period. The method includes flowing the purge gas through the secondary purge path during the second predetermined period.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 10 and 11 are flowcharts illustrating examples of methods using a secondary purge system according to the present disclosure.

DETAILED DESCRIPTION

Figure 1:
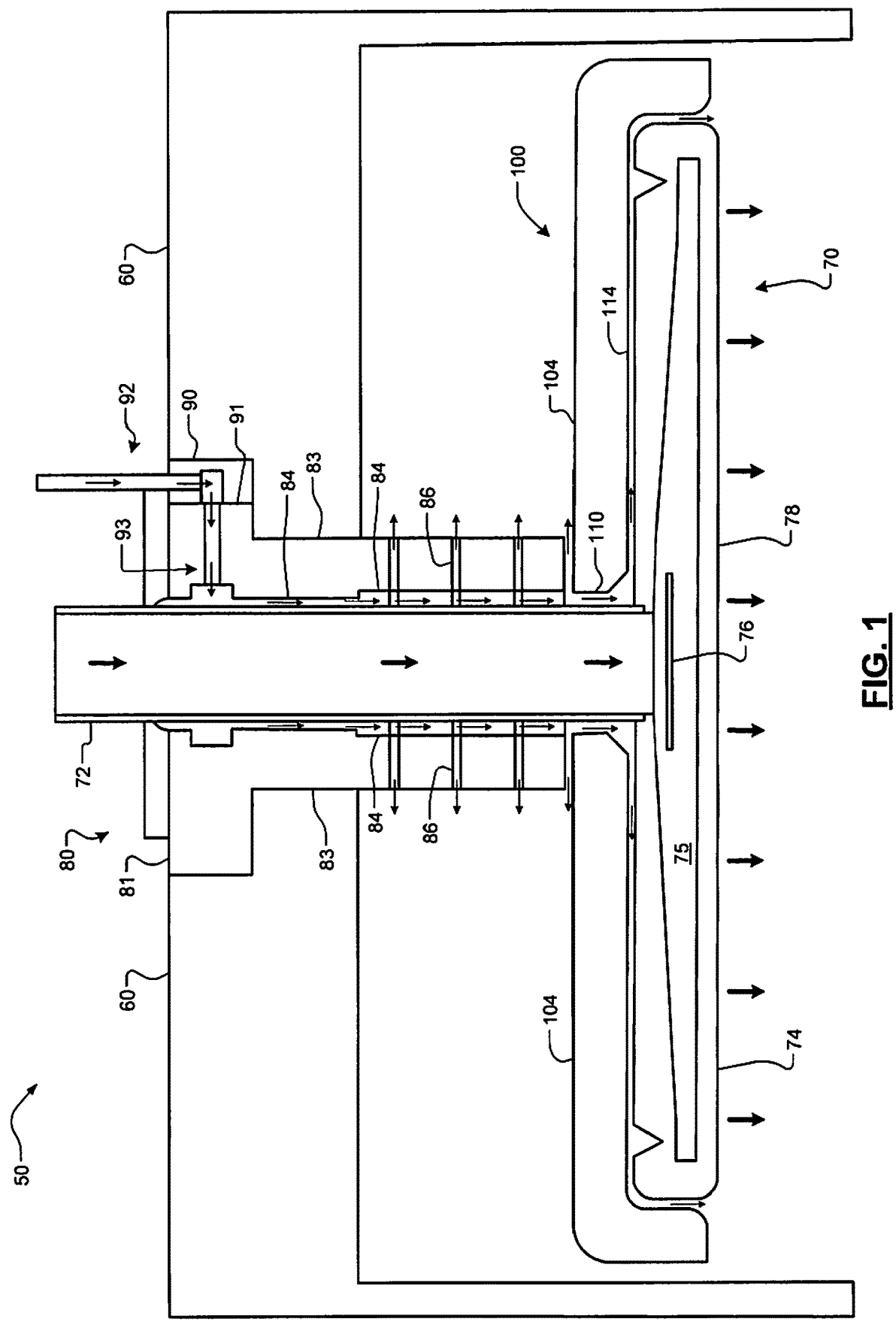
FIG. 1 is a cross-sectional view of an example of a processing chamber with a showerhead and primary and secondary purge flow paths according to the present disclosure.

The present disclosure describes systems and methods for removing excess precursor from a process chamber and preventing the precursor from flowing into specific areas such as the cavity behind the showerhead. The present disclosure also builds up chamber pressure using an inert gas instead of expensive film precursor. The higher chamber pressure acts as an air curtain for the precursor and thus increases the partial pressure of precursor in the substrate region while reducing pressure elsewhere. The higher chamber pressure lowers the chance of parasitic plasma due to the higher pressure regime.

The present disclosure introduces an axisymmetric inert gas flow from a backside of the showerhead. In some examples, the flow of purge gas in the cavity satisfies a Peclet condition (typically a Peclet number greater than one) to prevent back diffusion (or flow) of precursor into the cavity. As a result, chamber volume can be reduced while minimizing unwanted deposition in the cavity, which can be hard to clean. Further improvement may be accomplished by combining the backside flow with RF isolation/suppression devices. The RF isolation/suppression devices may reduce electric fields in the cavity, which reduces the chance of parasitic plasma.

In PEALD processes, the precursor needs to be alternatively present in the reaction chamber and then evacuated. To prevent parasitic deposition, the excess precursor in the processing chamber is removed from the processing chamber and the shared precursor pathways (such as the stem of the showerhead) before introducing the next precursor. The removal of excess precursor is usually done by purging the delivery pathway and chamber with inert gas.

When using a chandelier-type showerhead, the purge gas from the showerhead is not able to effectively remove the excess precursor trapped behind the showerhead. Therefore, the precursor can cause an appreciable amount of parasitic deposition on a back side of the showerhead, the top plate, and the processing chamber wall. It is not possible to fill the dead space with solid dielectric since that approach would likely cause RF coupling problems to ground.

In some examples, the cavity may be partially filled with ceramic and/or a series of spaced, stacked disks. The stacked disks behave as a string of capacitors connected in series. When the spaced, stacked disks are used, there is a net reduction in capacitance (as compared to the capacitance of each of the individual disks). The reduced capacitance also reduces RF coupled to the chamber walls. In some examples, the spacing of the disks is selected to prevent plasma formation between the disks. Gas flow between the disks is desirable to prevent neutral precursors from diffusing into these spaces and then depositing (parasitic deposition).

According to the present disclosure, a secondary purge is used to prevent the parasitic deposition without impacting the tool through-put and film quality. Also, the secondary purge system does not introduce dead volumes in and of itself that act as difficult to clean areas.

Referring now to FIG. 1, an example of a substrate processing system 50 including a processing chamber 60 having a showerhead 70 is shown. The showerhead 70 includes a stem portion 72 and a head portion 74. The head portion 74 defines an inner cavity 75. Fluids such as precursor or purge gas flow through the stem portion 72, onto a dispersion plate 76 and into the inner cavity 75. The fluids then pass through spaced holes 78 in a bottom surface of the head portion 74 and into the processing chamber.

The stem portion 72 of the showerhead 70 is connected to a top wall of the processing chamber 60 by a collar 80. The collar 80 has a generally "T"-shaped cross section and includes a head portion 81 and a stem portion 83. The collar 80 defines an inner cavity 84 that is cylinder-shaped and that receives the stem portion 72 of the showerhead 70. A plurality of slots 86 are formed in the stem portion 83 to allow fluid such as purge gas to flow from the inner cavity 84 to an outer surface of the stem portion 83.

A fluid connector 90 may be connected to an edge of the head portion 81 of the collar 80 and is used to supply fluid such as purge gas. The fluid connector 90 includes one or more conduits and/or connectors that are generally identified at 92. The head portion 81 of the collar 80 likewise includes conduits and/or connectors that are generally identified at 93 to direct the flow of fluid to the inner cavity 84 of the collar 80.

A plate 100 is arranged between the head portion 74 of the showerhead 70 and the collar 80. The plate 100 includes an upper surface 104, a centering opening or bore 110, and a bottom surface 114. In some examples, the plate 100 is made of ceramic. A thickness of the plate 100 may be selected to minimize material and capacitive coupling to ground or parasitic plasma. The upper surface 104 of the plate 100 is spaced from a bottom edge of the collar 80 to allow fluid to pass there between. The centering bore 110 is also spaced from the stem portion 72 to allow fluid to pass there between. The bottom surface 114 of the plate is spaced from the upper surface of the showerhead 70 to allow fluid to flow there between. In some examples, the plate 100 may be omitted and the processing chamber may be operated without the plate 100.

Flowing the purge gas through the collar inhibits process deposition chemistry from entering areas in the cavity to prevent unwanted film deposition there. Dimensions of the slots and other gaps may be selected to prevent plasma light-up therein and to allow for a Peclet condition to be satisfied to prevent back diffusion for the desired gas flow rates.

Figure 2:
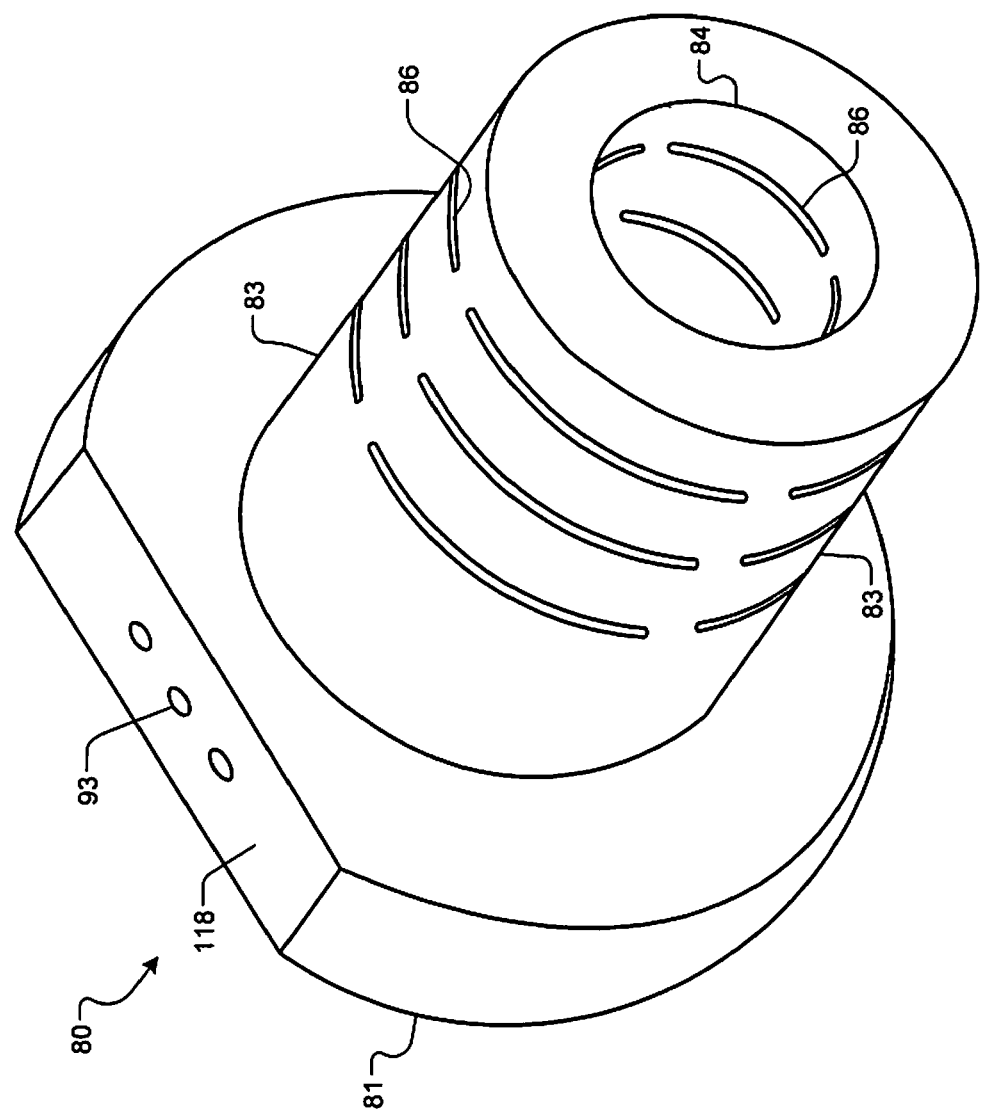
FIG. 2 is a perspective view of an example of a collar according to the present disclosure.

Referring now to FIG. 2, an example of the collar 80 is shown. The collar 80 includes the head portion 81 and the stem portion 83. The slots 86 may have an arcuate shape and may be arranged around the stem portion 83. The slots 86 allow fluid to flow from the inner cavity 84 through the slots 86. The head portion 81 may include a mating portion 118 that mates with a corresponding mating portion on the fluid connector 90. When connected, the conduit 93 of the collar 80 is aligned with the conduit 92 of the fluid connector 90.

Figure 3:
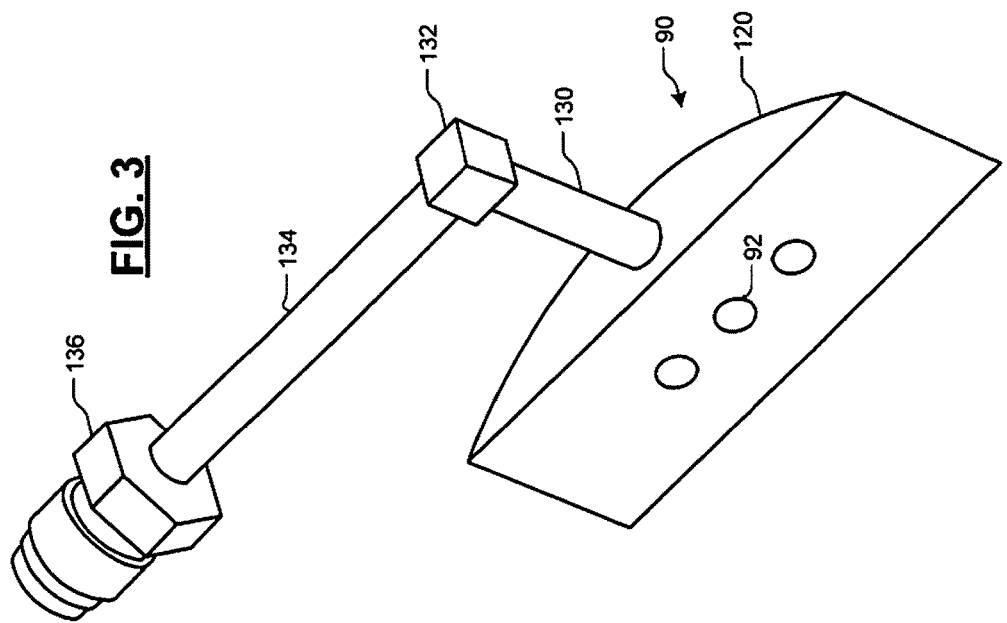
FIG. 3 is a perspective view of a fluid connector for the collar in FIG. 2 according to the present disclosure.

Referring now to FIG. 3, an example of the fluid connector 90 for the collar 80 is shown. While the fluid connector 90 is shown to include a second mating portion 120, a conduit 130, a connector 132, a conduit 134, and a connector 136, other configurations of the fluid connector are contemplated.

Figure 4A:
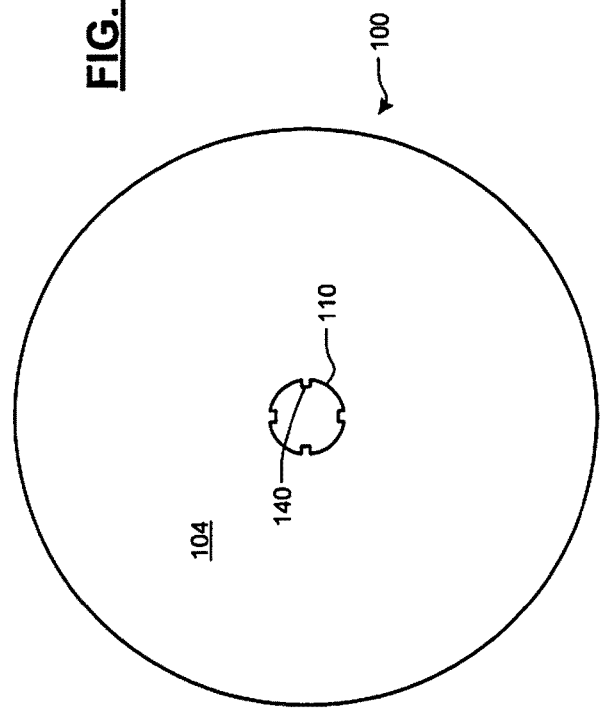
FIGS. 4A and 4B are top and bottom plan views of examples of plates according to the present disclosure.
Figure 4B:
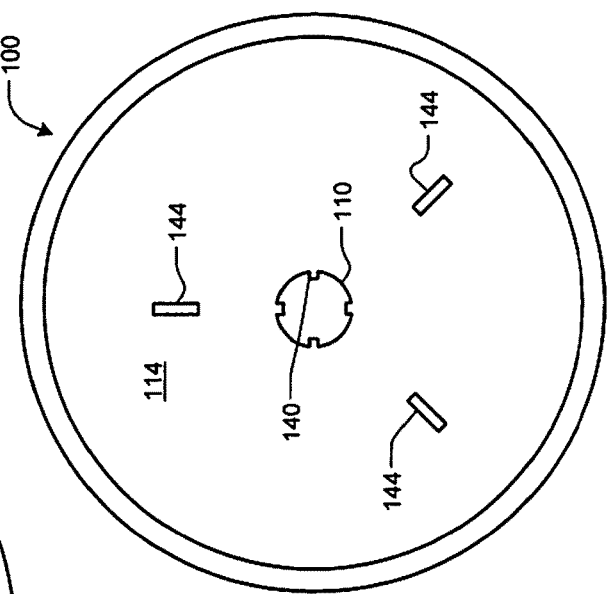

Referring now to FIGS. 4A and 4B, examples of the plate 100 is shown. In FIG. 4A, the upper surface 104 of the plate 100 is shown to have a generally circular cross-section and a centering bore 140 arranged at a center of the plate 100. The centering bore 110 includes one or more projections 140 that extend radially inwardly from the centering bore 110. The projections 140 provide uniform spacing between the plate 100 and the stem portion 72. In FIG. 4B, the bottom surface 114 of the plate 100 is shown to include projections 144 that extend downwardly relative to a top of the processing chamber. The projections 144 provide uniform spacing between the bottom surface 114 of the plate 100 and the upper surface of the head portion 74 of the showerhead 70. The projections 140 and 144 may provide spacing that is sufficiently close to prevent parasitic plasma. For example only, spacing of approximately 3 mm or less may be suitable to prevent parasitic plasma for typical process conditions. Using this spacing for typical process conditions, there is insufficient space for plasma to form along with plasma sheaths (less than two plasma sheath lengths). Formation of plasma may be affected by plasma density, plasma electron temperature, and voltage across the sheath.

Figure 5:
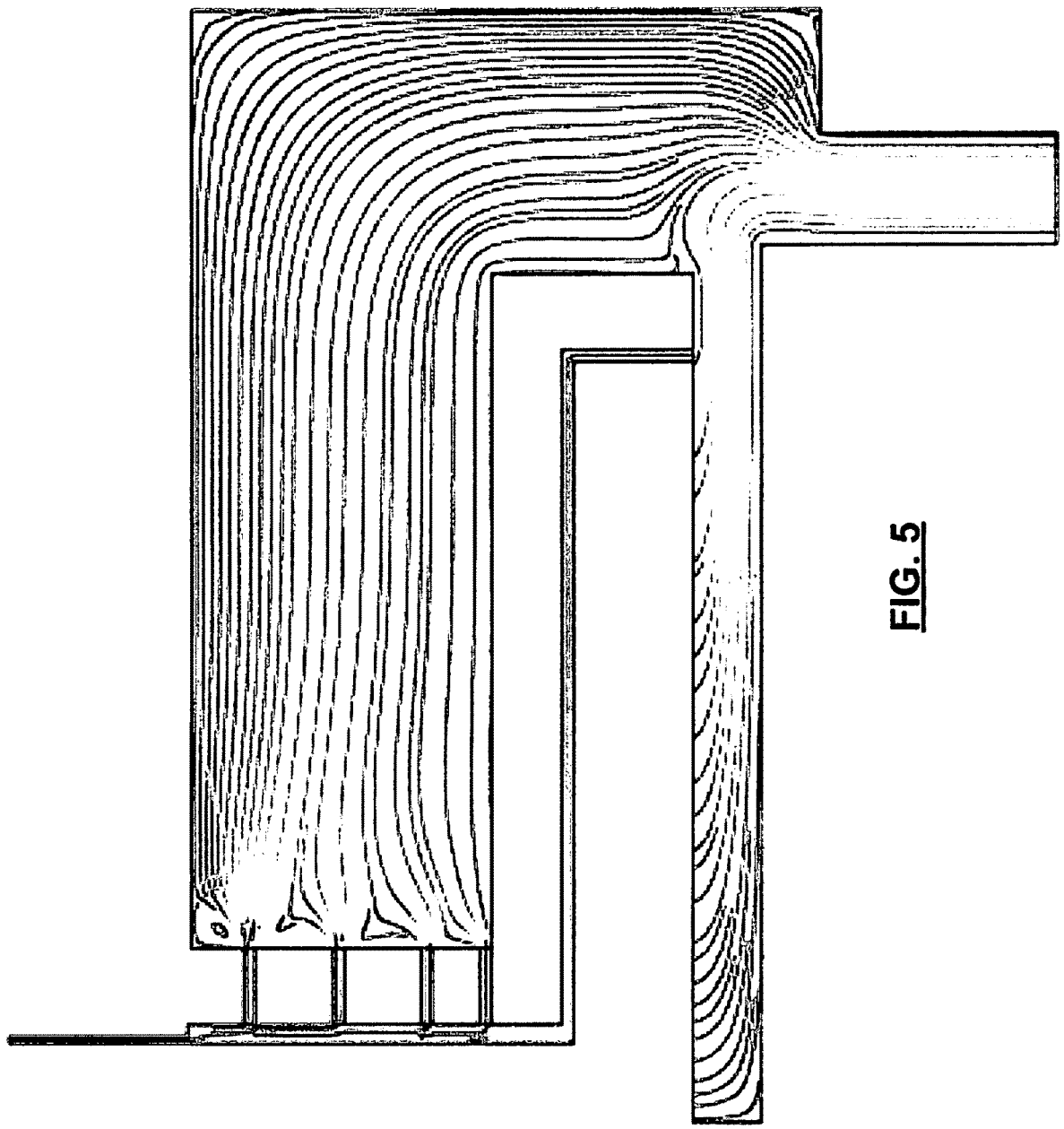
FIG. 5 is a flow model for the processing chamber in FIG. 1 according to the present disclosure.

Referring now to FIG. 5, a flow model for the processing chamber in FIG. 1 is shown. The flow model demonstrates that fluid such as purge gas flows without recirculation near the edge of the showerhead.

Figure 6:
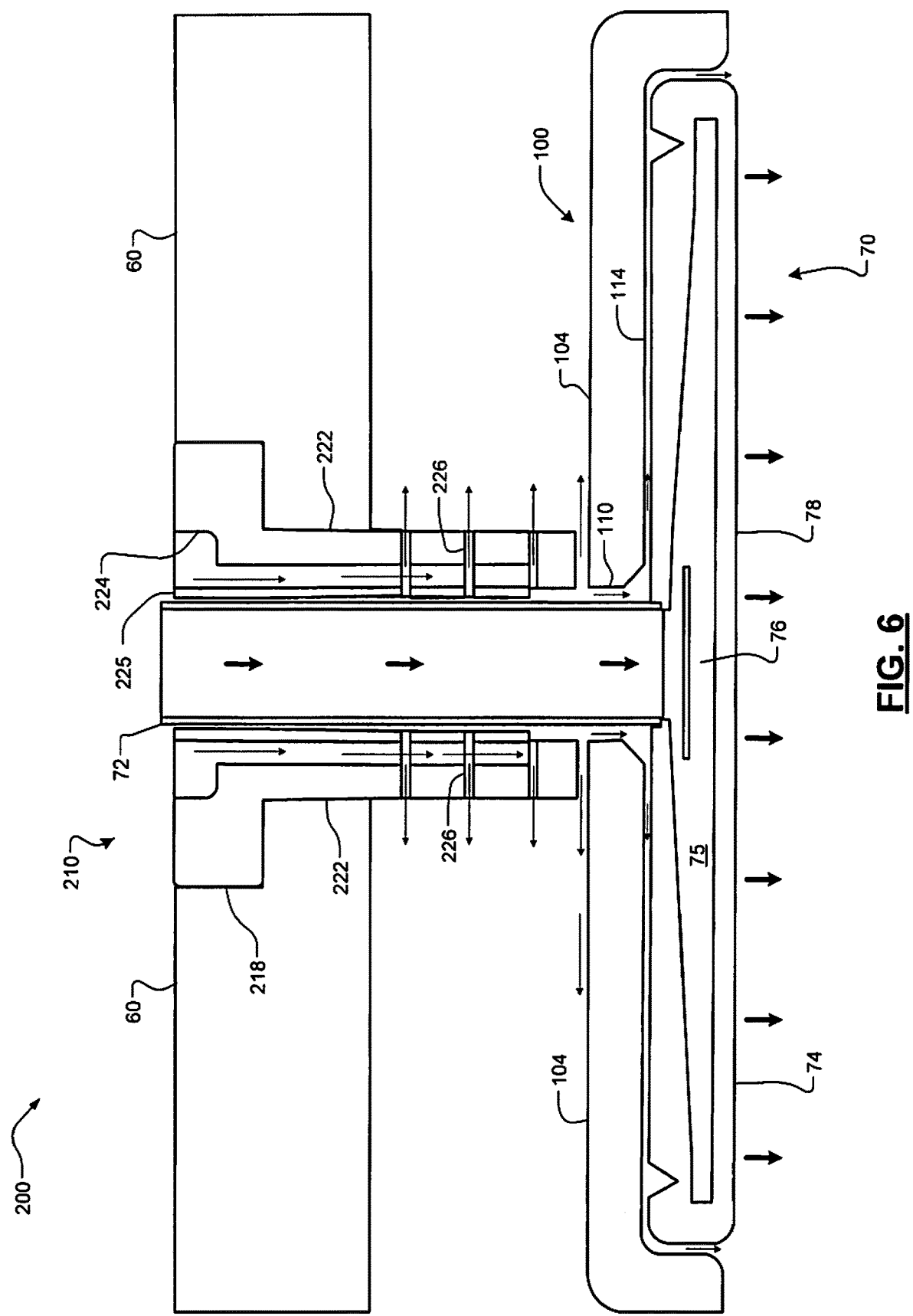
FIG. 6 is a cross-sectional view of another example of a processing chamber with a showerhead and a secondary purge flow path according to the present disclosure.

Referring now to FIG. 6, another example of a processing chamber 200 is shown. The stem portion 72 of the showerhead 70 is connected to a top wall of the processing chamber 60 by a collar 210. The collar 210 has a generally "T"-shaped cross section and includes a head portion 218 and a stem portion 222. The collar 210 defines a cavity 224 that is spaced from the stem portion 72 of the showerhead 70 by an inner wall 225 of the collar 210. Passageways 227 are connected to the cavity 224. A plurality of slots 226 are formed in the stem portion 222 to allow fluid such as purge gas to flow from the cavity 224 through the passageways 227 to an outer surface of the stem portion 222.

Dimensions of the slots, passageways and other gaps may be selected to have small enough geometries to prevent plasma light-up therein and to allow for a Peclet condition to be satisfied to prevent back diffusion for the desired gas flow rates.

Figure 7:
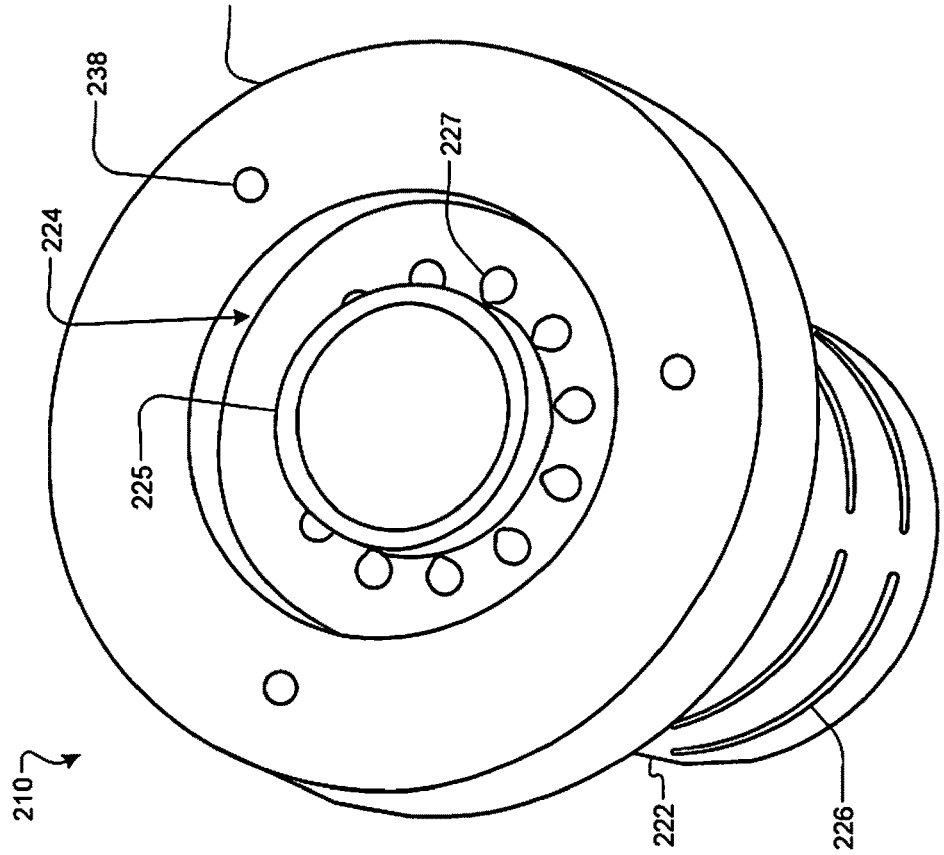
FIG. 7 is a perspective view of another example of a collar according to the present disclosure.

Referring now to FIG. 7, an example of the collar 210 is shown. The cavity 224 is connected to the passageways 227 that are located between the inner wall 225 and an outer wall of the stem portion 222. The passageways 227 are in fluid communication with the slots 226 to allow fluid to flow from the cavity 224 through the passageways 227 to the slots 226. One or more bores 238 may be provided to allow connections to be made to the collar 210. The collar 210 has more symmetric purge flow when the stem portion 72 is not coaxial with the collar 210. The collar 210 is therefore less sensitive to showerhead leveling.

Figure 8:
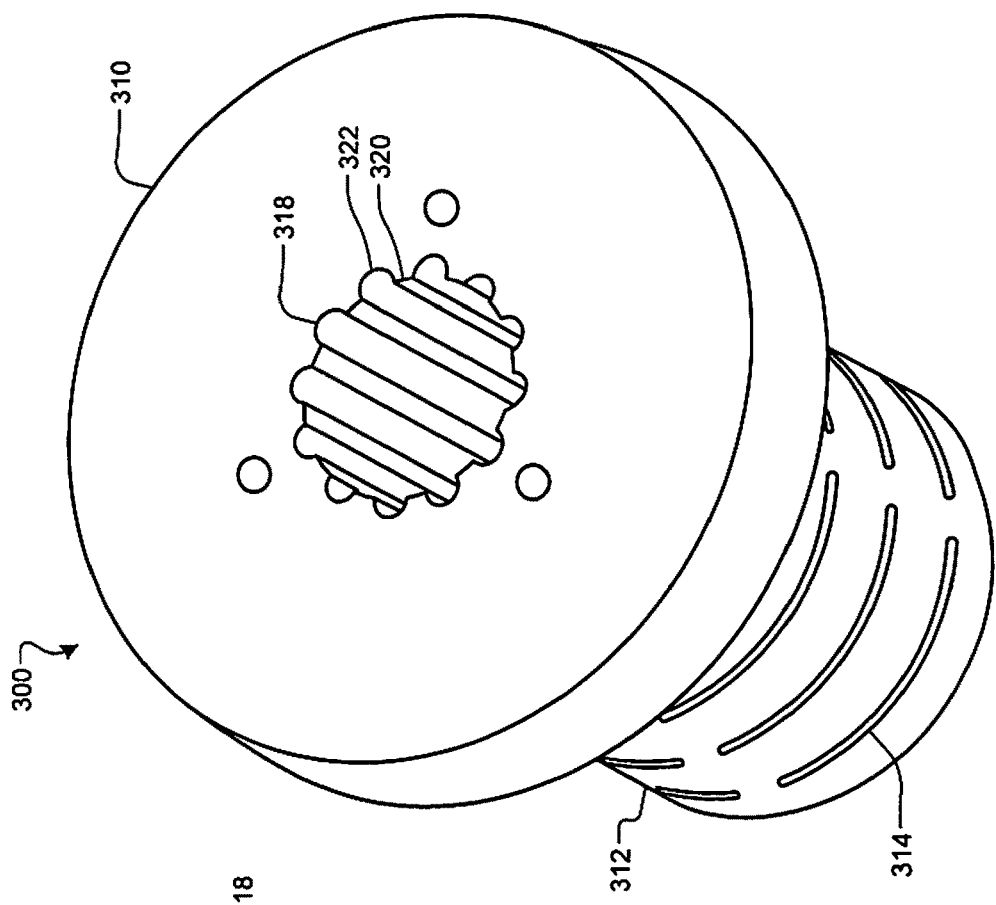
FIG. 8 is a perspective view of another example of a collar according to the present disclosure.

Referring now to FIG. 8, another example of a collar 300 is shown. The collar 300 includes a head portion 310 and a stem portion 312 including a plurality of slots 314. A central cavity 318 receives the stem portion 72 of the showerhead 70. The central cavity 318 includes a first plurality of surfaces 320 arranged substantially along a first diameter. A plurality of arcuate surfaces 322 curve radially outwardly and are interspersed between the first plurality of surfaces 322 to provide more area to receive fluid.

Figure 9:
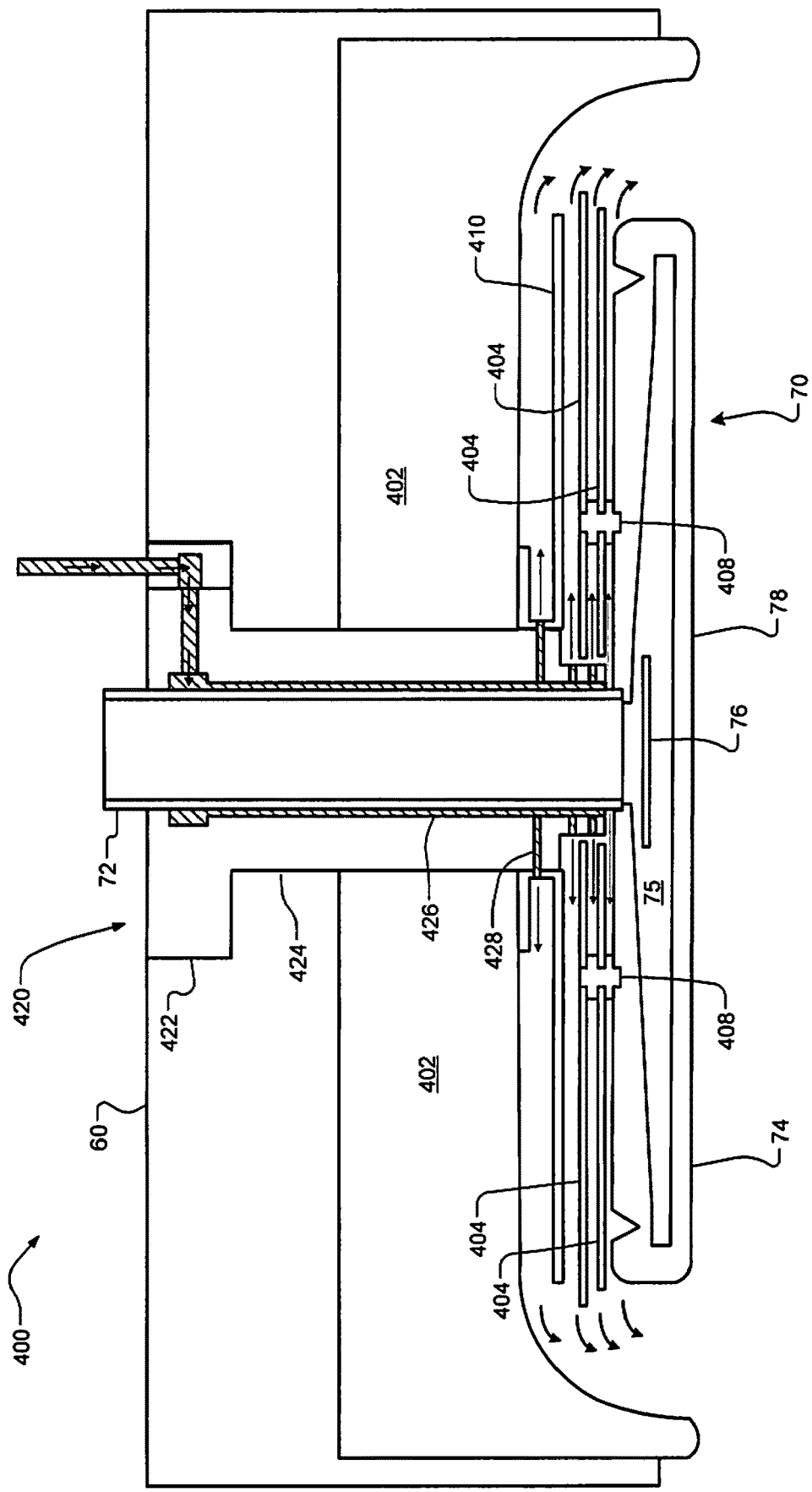
FIG. 9 is a cross-sectional view of still another example of a processing chamber with a showerhead and a secondary purge flow path according to the present disclosure.

Referring now to FIG. 9, another example of a processing chamber 400 is shown. Part of a cavity between an upper surface of the processing chamber 60 and the head portion of the showerhead is filled with a material 402 to reduce processing volume. One or more plates 404 are arranged around the stem portion 72 and above the head portion 74 of the showerhead 70. The plates may be made of a dielectric material.

Since the RF fields in the dielectric stack are still very high, plasma formation (plasma light-up) may occur between the plates 404. In some examples, a gap between the plates 404 is selected such that it is sufficiently small to prevent formation of "bulk" plasma. Spacers 408 can be used to provide uniform spacing above an upper surface of the head portion 74. Another plate 410 may be arranged in the cavity. The plate 410 may be made of a conducting or a dielectric material, may be connected to the upper surface of the processing chamber 60 and may extend generally parallel to the plates 404.

For example only when the gaps are less than or equal to about 3 mm, formation of plasma is prevented for pressures and power levels that are typically used. However, the size of the gaps may be set to other values for a different number of plates, different pressures and/or RF power levels. The size of the gaps and the number of dielectric layers or plates may be selected to prevent plasma formation between the dielectric layers during the semiconductor process for the selected species and selected process conditions such as temperature, pressure and RF power and frequency.

A collar 420 includes a head portion 422 and a stem portion 424 including a plurality of slots 428. A central cavity 426 receives the stem portion 72 of the showerhead 70 and provides additional space for fluid to flow. Fluid flows in the central cavity 426, through the slots 428 and between the plates 404 and 410. The plates 404 suppress plasma and also lower the chance of plasma being sustained in various locations between the plates, collars etc.

Referring now to FIGS. 10 and 11, flowcharts illustrating examples of methods using a secondary purge are shown. In FIG. 10, a first method 460 is shown. At 464, a substrate is exposed to a first precursor for a first predetermined period. At 468, when the first predetermined period ends, primary and secondary purges are performed. When the primary and secondary purges are complete, the substrate is exposed to a second precursor for a second predetermined period at 472. At 476, when the second predetermined period ends, primary and secondary purges may be performed. Additional processing may be performed as needed.

In FIG. 11, a method 500 that is similar to the method 460 is shown. However, the secondary fluid flow path is also operated during one or both of the precursor exposures. As can be appreciated, the secondary purge can also be operated only during one or both precursor exposures. At 504, a substrate is exposed to a first precursor for a first predetermined period while fluid flows through the secondary purge path. At 508, when the first predetermined period ends, primary and secondary purges are performed. When the primary and secondary purges are complete, the substrate is exposed to a second precursor for a second predetermined period while fluid flows through the secondary purge path at 512. At 516, when the second predetermined period ends, primary and secondary purges may be performed. Additional processing may be performed as needed.

Systems and methods according to the present disclosure use a combination of RF elements and flow elements to attack parasitic deposition in a multi-pronged manner. Systems and methods according to the present disclosure also provide near symmetric flow without creating additional parasitic plasma around the collar. Systems and methods according to the present disclosure do not have a negative impact on film throughput and non-uniformity.

Combined with a plasma suppression kit, systems and methods according to the present disclosure reduce the effective chamber volume, which provides substantial reduction in precursor consumption, which reduces operating cost and purge time. The ceramic plates help to lower the chance of generation of plasma and also lower the chance of plasma being sustained in various locations between the plates, collars etc. For example in FIG. 9, the space between the plate 100 and the top plate is filled with plates that suppress plasma.

Systems and methods according to the present disclosure also eliminate time-varying contamination of the ambient and elimination of chemical reactions behind the showerhead.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A substrate processing system, comprising:
    a chamber;
    a showerhead that comprises a head portion and a stem portion and that is configured to deliver gas to the chamber; and
    a plate that includes an opening at a center of the plate that extends through the plate, wherein:
        the plate is interposed between the head portion and a top wall of the chamber such that a gap exists between the plate and the top wall of the chamber,
        the stem portion is positioned through the opening, and
        the plate is offset from the head portion.

2. The substrate processing system of claim 1, wherein:
    the head portion has an outer head portion diameter, and
    the plate has an outer plate diameter that is larger than the outer head portion diameter.

3. The substrate processing system of claim 1, wherein the stem portion extends from a top wall of the chamber.

4. The substrate processing system of claim 1, wherein gas is configured to flow into the chamber and onto the plate.

5. The substrate processing system of claim 4, wherein:
    the plate includes a top side that faces the top wall of the chamber, and
    gas is configured to flow onto the top side of the plate.

6. The substrate processing system of claim 1, wherein the plate is parallel with the top wall of the chamber.

7. The substrate processing system of claim 1, wherein the plate has a circular cross-section.

8. The substrate processing system of claim 1, wherein the plate further includes:
    a bottom surface that faces the head portion of the showerhead, and
    one or more first projections that extend from the bottom surface of the plate.

9. The substrate processing system of claim 8, wherein the one or more first projections contact the head portion of the showerhead.

10. The substrate processing system of claim 1, wherein the plate includes one or more second projections that extend radially inward into the opening.

11. The substrate processing system of claim 10, wherein the one or more second projections contact the stem portion of the showerhead.

12. The substrate processing system of claim 1, further comprising a showerhead collar that includes:
- a collar stem portion,
- a central cavity that extends through the center of the collar stem portion and is configured to receive a showerhead stem portion of a showerhead,
- a plurality of slots that extend through an outer cylindrical side surface of the showerhead collar and into the collar stem portion, and
- a plurality of first passages that extend through the collar stem portion in a direction parallel to the central cavity, and that are fluidically connected to the plurality of slots such that gas is configured to flow from the first passages to the plurality of slots.

* * * * *